US00RE44221E

(19) United States
(12) Reissued Patent
Yang

(10) Patent Number: US RE44,221 E
(45) Date of Reissued Patent: May 14, 2013

(54) METHOD FOR VERIFYING MASK PATTERN OF SEMICONDUCTOR DEVICE

(75) Inventor: Hyun Jo Yang, Chungcheongbuk-do (KR)

(73) Assignee: Hynix Semiconductor Inc., Icheon-si (KR)

(21) Appl. No.: 13/507,529

(22) Filed: Jul. 5, 2012

Related U.S. Patent Documents

Reissue of:
(64) Patent No.: 7,752,584
Issued: Jul. 6, 2010
Appl. No.: 11/965,201
Filed: Dec. 27, 2007

(30) Foreign Application Priority Data

Jun. 27, 2007 (KR) ..... 10-2007-0063926

(51) Int. Cl.
*G06F 17/50* (2006.01)

(52) U.S. Cl.
USPC ..... 716/51; 716/50; 716/52; 716/53; 716/54; 716/55; 716/56; 716/136; 716/139

(58) Field of Classification Search ..... 716/50–56, 716/136, 139; 430/5, 30
See application file for complete search history.

(56) References Cited

U.S. PATENT DOCUMENTS

| | | | |
|---|---|---|---|
| 7,194,709 | B2 | 3/2007 | Brankner |
| 7,254,804 | B2 | 8/2007 | Inazu |
| 7,275,227 | B1 | 9/2007 | Ying |
| 7,475,383 | B2 | 1/2009 | Suh et al. |
| 2005/0142455 | A1 | 6/2005 | Ando |

FOREIGN PATENT DOCUMENTS

| | | |
|---|---|---|
| KP | 10-2003-0014427 | 2/2003 |
| KP | 10-2006-0105847 | 10/2006 |
| KR | 10-0156792 | 4/1996 |
| KR | 10-0172558 | 10/1998 |
| KR | 10-0673014 | 1/2007 |
| KR | 10-0673014 B1 | 1/2007 |

*Primary Examiner* — Nghia Doan
(74) *Attorney, Agent, or Firm* — Marshall, Gerstein & Borun LLP

(57) ABSTRACT

Provided is a method for verifying a pattern of a semiconductor device. In the method, a designed layout of target patterns is provided, and transferring the designed layout on a wafer to form wafer patterns. Wafer patterns image contour is obtain. The image contour for wafer patterns on the designed layout are matched, After edge differences between the designed layout and the wafer patterns image contour are extracted, a checking layout for detecting wafer pattern defects is obtain by adding the edge differences on the designed layout. Defects on the checking layout is identified to verify the patterns in view of processes before fabrication of a photomask.

18 Claims, 4 Drawing Sheets

METHOD FOR VERIFYING MASK PATTERN OF SEMICONDUCTOR DEVICE

Matter enclosed in heavy brackets [ ] appears in the original patent but forms no part of this reissue specification; matter printed in italics indicates the additions made by reissue.

CROSS-REFERENCE TO RELATED APPLICATIONS

This patent claims priority to Korean patent application number 10-2007-0063926, filed on Jun. 27, 2007, the disclosure of which is incorporated by reference in its entirety.

BACKGROUND OF THE INVENTION

This patent relates to a method for fabricating a semiconductor device, and more particularly, to a method for verifying a pattern of a semiconductor device.

With the increase in integration degree of semiconductor devices, patterns required in semiconductor devices shrink in size gradually, which leads to pattern defects, e.g., a pattern bridge or a pinch fail, on an actual wafer due to limitations in a manufacturing process of semiconductor devices. Accordingly, before the verification of designed target patterns and the preparation of a mask, weak or defective parts in view of processes are detected in advance and the detection results are then reflected in a design layout.

One of a conventional method for verifying pattern defects has been suggested, where an image of patterns formed on an actual wafer is compared with an original layout and then different parts there between resulted from the comparison are detected as defects. However, the original layout may be modified several times so as to be favorable to wafer patterning while an actual wafer process is performed. Once the original layout is modified, different parts between patterns on the actual wafer and a modified layout are detected as defects in the verification of pattern defects. Parts modified from the original layout are detected as the defects. Therefore, it is difficult to detect defects occurring on the actual wafer, e.g., pattern bridges or pinch fails.

SUMMARY OF THE INVENTION

In one embodiment, a method for verifying a pattern of a semiconductor device, includes: providing a designed layout of target patterns; transferring the designed layout on a wafer to form wafer patterns; obtaining a image contour of the wafer patterns; matching the image contour of the wafer patterns on the designed layout; extracting edge differences between the designed layout and image contour of the wafer patterns; obtaining a checking layout for detecting wafer pattern defects by adding the edge differences on the designed layout; and identifying defects on the checking layout. The designed layout may include one of an original layout for the target pattern or an optical proximity corrected layout of the original layout. The transferring the designed layout on a wafer may include: fabricating a photomask using the designed layout for the target pattern; and forming wafer patterns on the wafer using the fabricated photomask; The obtaining the image contour may include performing with the aid of a scanning electron microscope. The extracting edge differences may include: comparing an edge point of a pattern of the designed layout with an edge point of a wafer pattern of the image contour; converting differences between the edge points of the wafer pattern of the image contour and the edge point on a pattern the designed layout into a GDS data; and storing the GDS data. The obtaining a checking layout may include converting a critical dimension of a pattern of the designed layout into a critical dimension of a pattern of the checking layout by adding the edge difference in an edge point of the pattern of the designed layout. The identifying defects may include: dividing the checking layout into a line pattern region and a space region; and detecting of the defects in the line pattern region and in the space region. The detecting the line pattern region may include: providing a reference critical dimension value of the line pattern; and determining whether a critical dimension of a pattern in the checking layout deviates from the reference critical dimension value. The detecting the defects in the space region may include: providing a reference dispacing value between line patterns; and determining whether a dispacing between line patterns in the checking layout deviates from the reference dispacing value 10. The method may further include, after identifying defects, performing another optical proximity correction by feed back the detected defects on the designed layout.

DESCRIPTION OF SPECIFIC EMBODIMENTS

Hereinafter, a method for verifying a pattern of a semiconductor device in accordance with the preferred embodiment of the invention will be described in detail with reference to the accompanying drawings.

Figure 1:
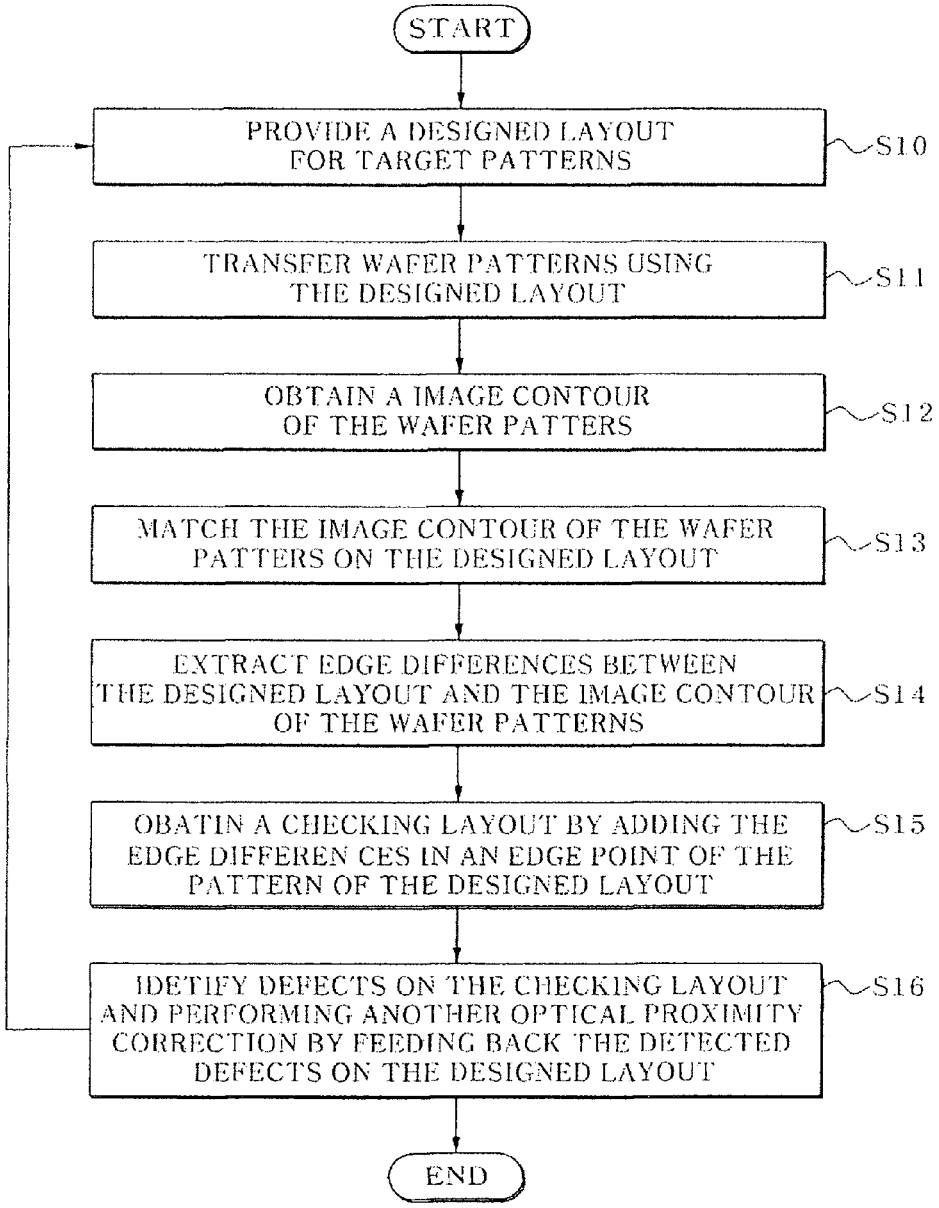
FIG. 1 is a flow chart illustrating a method for verifying a pattern of a semiconductor device according to an embodiment of the invention.
Figure 2:
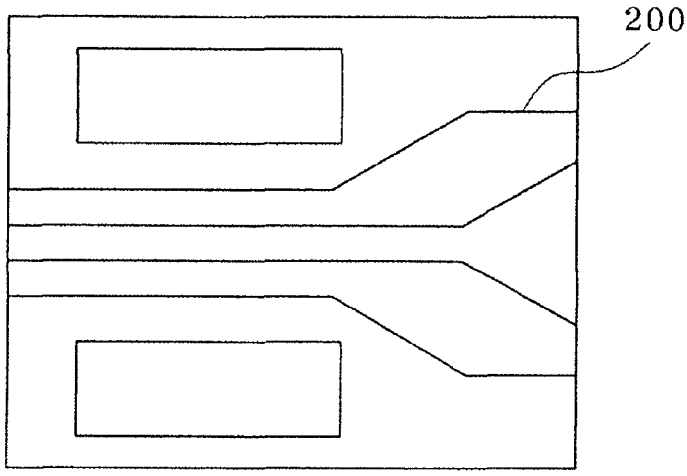
FIGS. 2 to 6 are schematic plan views illustrating the method of FIG. 1, in accordance with an embodiment of the invention.

Referring to FIG. 1, a designed layout 200 is provided for target patterns, as illustrated in FIG. 2 (S10). In detail, a designer designs patterns using patterns to be realized on a wafer and data containing information. The layout 200 is designed in a layout editor such that it has the same shape as the wafer patterns which will be formed on an actual wafer. The layout 200 may be an original layout that a designer designs for the first time or an optical proximity corrected layout (OPC layout) for suppressing optical proximity effect on the original layout.

Wafer patterns is transferred on the actual wafer using the designed layout 200(S11). Specifically, a photomask having the same pattern configuration as the designed layout 200 for the target patterns is fabricated, and wafer patterns are then formed on the actual wafer using the fabricated photomask.

The wafer patterns formed on the actual wafer are photographed with a scanning electron microscope (SEM), to obtain an image contour of the wafer patterns (S12). Other types of technique may be used.

Figure 3:
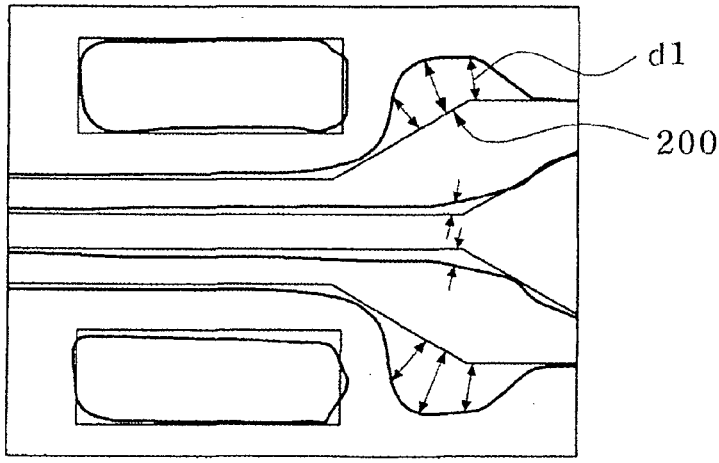

The image contour of wafer patterns on the designed layout are matched, as illustrated in FIG. 3. (S13). Thereafter, Edge differences between the designed layout 200 and the image contour of the wafer patterns are extracted (S14). In detail, edge points of patterns the designed layout 200 are compared with those of the image contour of wafer patterns through a measuring apparatus (not shown). Edge differences between the edge points of the patterns of the designed layout 200 and the edge point on a wafer pattern image contour are converted into, for example, a GDS data and the GDS data are stored. Herein, the GDS data refers to a difference between critical dimensions d1 (as depicted in FIG. 3) in the edge points of the image contour of wafer patterns and the patterns on the designed layout 200.

Figure 4:
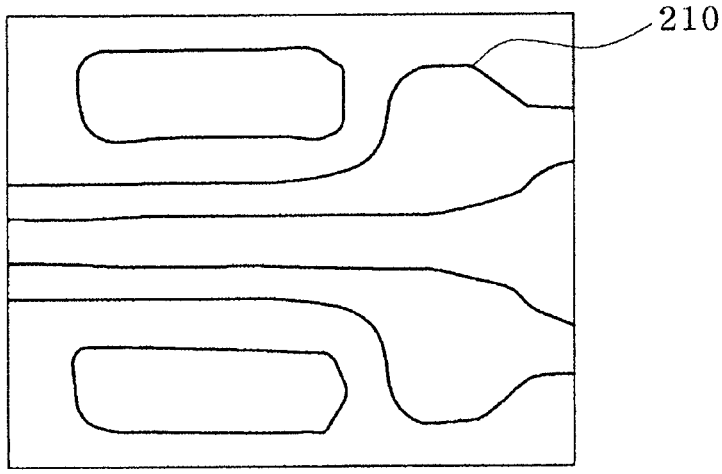

A checking layout 210 for detecting wafer pattern defects by adding the edge differences on the designed layout are obtained, as illustrated in FIG. 4. (S15). That is, the stored GDS data are reflected in the edge points of the designed layout 200 designed in the layout editor so that the critical dimension of the designed layout 200 can be converted into the critical dimension of the wafer patterns formed on the actual wafer.

Defects on the checking layout 210 is identified to verify the patterns in view of processes before the preparation of a mask (S16). At this time, the identify may be performed in such a manner than the checking layout 210 is divided into a line pattern region and a space region and the identify may be detecting of the line pattern region and in the space region, respectively.

Figure 5:
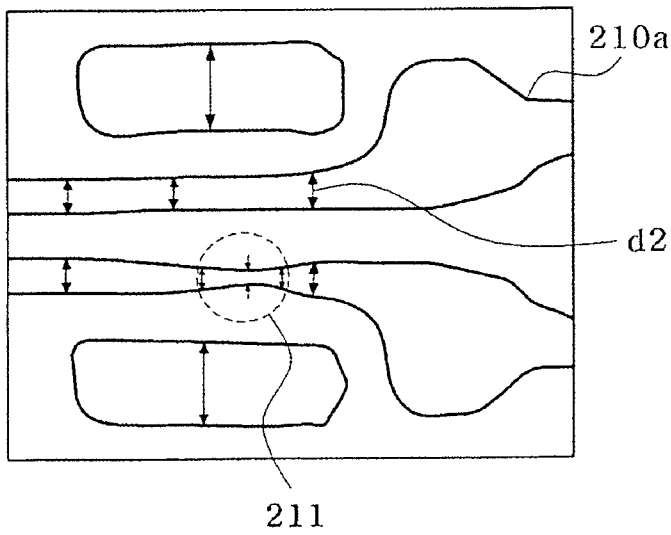

For example, in the line pattern region, it is provided a reference critical dimension (CD) value of the line patterns and determined whether or not critical dimensions d2 of the line patterns in the checking layout 210a deviate from the reference critical dimension, as illustrated in FIG. 5. When it is determined that the critical dimensions (CD) d2 of the line patterns in the checking layout 210a deviate from the reference critical dimension value, this point is detected as a weak point, e.g., a pinch fail 211.

Figure 6:
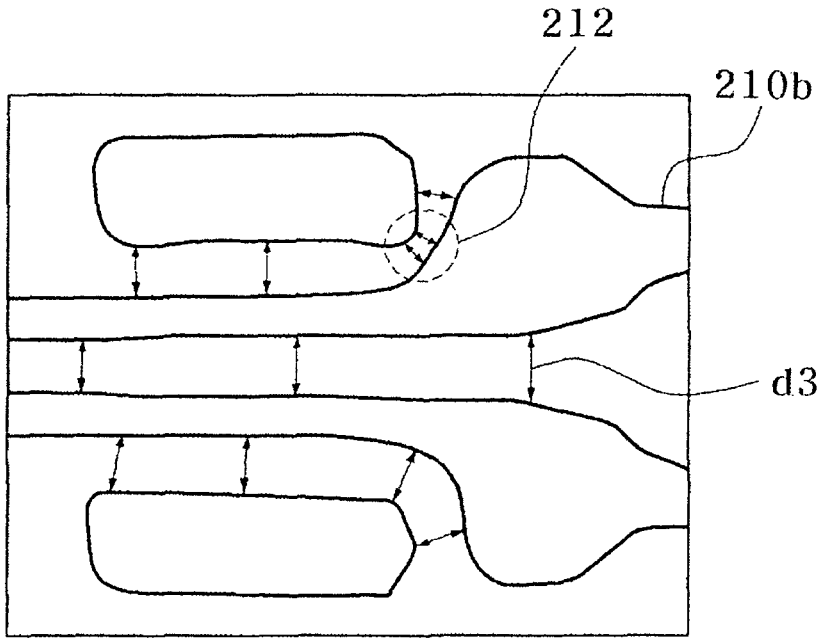

In the space region, it is provided a reference dispacing value between line patterns and determined whether or not a dispacing d3 between the line patterns in the checking layout 210b deviates from the reference dispacing value, as illustrated in FIG. 6. When it is determined that the dispacing d3 between the line patterns included in the checking layout 210b deviates from the reference dispacing value, this point is detected as a weak point e.g., a bridge defect 212.

The designed layout is corrected taking into account of how much the detected defects have an effect on a process window according to pattern verification results (S16). In detail, the designed layout is performing another optical proximity correction by feed back the detected defects on the designed layout. In the case where the pattern verification is performed on the original layout, the OPC process is performed in consideration of the detected defects. When the pattern verification is performed on the OPC layout, the OPC process may be re-executed In on embodiment, a method for verifying a pattern of a semiconductor device, the checking layout has the same shape as the wafer pattern formed on the wafer is obtained by adding the edge differences on the designed layout, and the checking layout is verified for detecting wafer pattern defects. Therefore, defects occurring on the wafer patterns, e.g., patterns bridges or pinch fail can be effectively detected. Moreover, the defects is accurate estimate before the fabrication of a mask can be effectively prevented re-adjustment or re-fabrication.

Although preferred embodiments of the invention have been disclosed for illustrative purposes, those skilled in the art will appreciate that various modifications, additions and substitutions are possible, without departing from the scope and spirit of the invention as defined in the accompanying claims.

What is claimed is:

1. A method for verifying a mask pattern of a semiconductor device, the method comprising:

providing a designed layout of target patterns;

forming wafer patterns on a wafer by transferring the designed layout on the wafer;

obtaining an image contour of the wafer patterns from the wafer;

matching the image contour of the wafer patterns on the designed layout;

extracting edge differences data between edge points of the designed layout and the image contour of the wafer patterns;

generating checking layout for detecting wafer pattern defects by including the edge differences data on a data of the designed layout; and checking defects on the checking layout.

2. The method of claim 1, wherein the designed layout comprises one of an original layout for the target pattern or an optical proximity corrected layout of the original layout.

3. The method for claim 1, wherein the step of transferring the designed layout on a wafer further comprising:

fabricating a photomask using the designed layout for the target pattern; and forming wafer patterns on the wafer using the fabricated photomask.

4. The method of claim 1, wherein the step of obtaining the image contour is performed with the aid of a scanning electron microscope.

5. The method of claim 1, wherein the step of extracting edge differences further comprising:

comparing an edge point of a pattern of the designed layout with an edge point of a wafer pattern of the image contour;

converting differences between the edge points of the wafer pattern of the image contour and the edge point on a pattern designed layout into a GDS data; and storing the GDS data.

6. The method of claim 1, wherein the step of obtaining a checking layout converting a critical dimension of a pattern of the designed layout into a critical dimension of a pattern of the checking layout by adding the edge difference in an edge point of the pattern of the designed layout.

7. The method of claim 1, wherein the step of identifying defects further comprising:

dividing the checking layout into a line pattern region and a space region; and detecting of the defects in the line pattern region and in the space region.

8. The method of claim 7, wherein the step of detecting the line pattern region further comprising:

providing a reference critical dimension value of the line pattern; and determining whether a critical dimension of a pattern in the checking layout deviates from the reference critical dimension value.

9. The method of claim 7, wherein the step of detecting the defects in the space region comprising: providing a reference dispacing value between line patterns; and determining whether a dispacing between line patterns in the checking layout deviates from the reference dispacing value.

10. The method of claim 2, further comprising performing another optical proximity correction by feed back the detected defects on the designed layout.

11. A method for verifying a mask pattern of a semiconductor device, the method comprising:

providing a designed layout of target patterns;

forming wafer patterns on a wafer by transferring the designed layout on the wafer;

obtaining an image contour of the wafer patterns from the wafer;

matching the image contour of the wafer patterns on the designed layout;

extracting edge differences data between edge points of the designed layout and the image contour of the wafer patterns;

generating a checking layout for detecting wafer pattern defects by including the edge differences data in an edge point of the pattern of the designed layout to convert a critical dimension of a pattern of the designed layout into a critical dimension of a pattern of the checking layout;

providing a reference critical dimension value for a pattern; and determining whether the critical dimension of the pattern of the checking layout deviates from the reference critical dimension value.

12. The method of claim 11, wherein the designed layout comprises one of an original layout for the target pattern or an optical proximity corrected layout of the original layout.

13. The method of claim 11, wherein the step of extracting edge differences further comprising:

comparing an edge point of a pattern of the designed layout with an edge point of a wafer pattern of the image contour;

converting differences between the edge points of the wafer patterns of the image contour and the edge point on a pattern designed layout into a GDS data; and storing the GDS data.

14. The method of claim 12, further comprising performing another optical proximity correction by feed back the detected defect to the designed layout.

15. A method for verifying a mask pattern of a semiconductor device, the method comprising:

providing a designed layout of target patterns;

forming wafer patterns on a wafer by transferring the designed layout on the wafer;

obtaining an image contour of the wafer patterns from the wafer;

matching the image contour of the wafer patterns on the designed layout;

extracting edge differences data between the edge points of the designed layout and the image contour of the wafer patterns;

generating a checking layout for detecting wafer pattern defects by including the edge differences data in an edge point of the pattern of the designed layout to convert a critical dimension of a pattern of the designed layout into a critical dimension of a pattern of the checking layout;

providing a reference dispacing value for a dispacing between patterns; and determining whether the dispacing between the pattern of the checking layout deviates from the reference dispacing value.

16. The method of claim 15, wherein the designed layout comprises one of an original layout for the target pattern or an optical proximity corrected layout of the original layout.

17. The method of claim 15, wherein the extracting edge differences further comprising:

comparing an edge point of a pattern of the designed layout with an edge point of a wafer pattern of the image contour;

converting differences between the edge points of the wafer pattern of the image contour and the edge point on a pattern designed layout into a GDS data; and storing the GDS data.

18. The method of claim 16, further comprising performing another optical proximity correction by feed back the detected defects to the designed layout.

* * * * *